(12) United States Patent
Moll et al.

(10) Patent No.: US 7,045,711 B2
(45) Date of Patent: May 16, 2006

(54) MODULE FOR A DATA CARRIER WITH IMPROVED BUMP COUNTERPARTS

(75) Inventors: Rainer Moll, Graz (AT); Michael Rabe, Bruchköbel (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 28 days.

(21) Appl. No.: 10/511,460

(22) PCT Filed: Apr. 3, 2003

(86) PCT No.: PCT/IB03/01356

§ 371 (c)(1),
(2), (4) Date: Oct. 14, 2004

(87) PCT Pub. No.: WO03/088140

PCT Pub. Date: Oct. 23, 2003

(65) Prior Publication Data

US 2005/0230482 A1 Oct. 20, 2005

(30) Foreign Application Priority Data

Apr. 16, 2002 (EP) .................................. 02100383

(51) Int. Cl.
*H01L 23/28* (2006.01)
(52) U.S. Cl. ...................... 174/52.1; 257/673; 257/676
(58) Field of Classification Search ............... 174/52.1, 174/260, 52.2; 257/672, 673, 676; 361/772–774
See application file for complete search history.

(56) References Cited

U.S. PATENT DOCUMENTS

| 5,326,428 | A | * | 7/1994 | Farnworth et al. ........... 324/724 |
| 5,483,741 | A | * | 1/1996 | Akram et al. .................. 29/846 |
| 6,281,448 | B1 | * | 8/2001 | Tsukamoto .................. 174/260 |
| 6,297,562 | B1 | | 10/2001 | Tilly |
| 6,365,967 | B1 | | 4/2002 | Hembree et al. |
| 6,465,879 | B1 | * | 10/2002 | Taguchi ....................... 257/673 |
| 6,756,661 | B1 | * | 6/2004 | Tsuneda et al. .............. 257/673 |
| 6,864,423 | B1 | * | 3/2005 | Tan et al. .................... 174/52.2 |

FOREIGN PATENT DOCUMENTS

DE 198 31 565 10/1999

* cited by examiner

*Primary Examiner*—Dean A. Reichard
*Assistant Examiner*—Adolfo Nino
(74) *Attorney, Agent, or Firm*—Adam L. Stroud

(57) ABSTRACT

In a data carrier (1), or a module (3) for such a data carrier (1), the module (3) has an integrated component (4) with at least two projecting connection contacts (5, 6) and, for each connection contact (5, 6), a connecting part (7, 8) which is electrically conductively connected thereto, the connecting parts (7, 8) consisting of metal, being constructed so as to be plate-shaped, and including remnants (11) of raised portions which have been formed by mechanical deformation of the connecting parts (7, 8).

12 Claims, 1 Drawing Sheet

MODULE FOR A DATA CARRIER WITH IMPROVED BUMP COUNTERPARTS

The invention relates to a module for a data carrier, which module includes an integrated component with at least two connection contacts and, for each connection contact, a connecting part which is electrically conductively connected to the relevant connection contact, the connection contacts being constructed so as to project from the integrated component and the connecting parts consisting of metal and being constructed so as to be plate-shaped.

The invention also relates to a data carrier provided with a module which includes an integrated component with at least two connection contacts and, for each connection contact, a connecting part which is electrically conductively connected to the relevant connection contact, the connection contacts being constructed so as to project from the integrated component and the connecting parts consisting of metal and being constructed so as to be plate-shaped.

Various versions of a data carrier of the kind set forth in the second paragraph and of a module of the kind set forth in the first paragraph are at present being marketed by Applicant and hence are known. The integrated component in the known versions has two connection contacts in the form of so-called bumps which are provided on so-called pads of the integrated component by means of a galvanic method. Such galvanically produced bumps have an essentially plane boundary surface with slightly raised edge zones, the two boundary surfaces of the two connection contacts nominally being situated in one plane in the known versions. Because of the fact that the boundary surfaces of the connection contact nominally are situated in one plane, for the manufacture of the known versions it is necessary to perform and maintain a very exact adjustment of the parallelism of the integrated component with its connection contacts, bounded by the plane boundary surfaces and the plate-shaped connecting parts, so that this parallelism must meet very severe requirements so as to ensure a reliable and perfect electrically conductive connection between each connection contact and the relevant connecting part. In order to meet such severe requirements, a large amount of work must be spent on the manufacture of a known module or a known data carrier, thus increasing the cost of the manufactured products while still involving, despite the major effort made, a significant degree of uncertainty as regards the realization of a perfect electrically conductive connection between the connection terminals and the connecting parts.

It is an object of the invention to avoid the described problems and to realize an improved module and an improved data carrier in a simple manner while using simple means.

In order to achieve this object, a module is provided with the features in accordance with the invention in such a manner that a module in accordance with the invention can be characterized as follows:

A module for a data carrier, which module includes an integrated component with at least two connection contacts and, for each connection contact, a connecting part which is electrically conductively connected to the relevant connection contact, the connection contacts being constructed so as to project from the integrated component and the connecting parts consisting of metal and being constructed so as to be plate-shaped, the connecting parts comprising remnants of raised portions which have been formed by mechanical deformation of the connecting parts, which remnants project from the connecting parts in the direction of the connection contacts.

In order to solve the above object, steps are taken for a data carrier in accordance with the invention such that a data carrier in accordance with the invention can be characterized as follows:

A data carrier with a module, which module includes an integrated component with at least two connection contacts and, for each connection contact, a connecting part which is electrically conductively connected to the relevant connection contact, the connection contacts being constructed so as to project from the integrated component and the connecting parts consisting of metal and being constructed so as to be plate-shaped, the connecting parts comprising remnants of raised portions which have been formed by mechanical deformation of the connecting parts, which remnants project from the connecting parts in the direction of the connection contacts.

By taking the steps in accordance with the invention it is simply achieved that, while making a small additional effort only, the electrically conductive connection between each connection contact of the integrated component and the connecting part electrically connected to the connection contact is realized by means of the remnants of raised portions, the remnants of raised portions ensuring with absolute certainty, because they are small in respect of surface, and hence in respect of contact, in comparison with the surface dimensions of the connection contacts and the connecting parts, that at least one remnant of this kind provides a raised portion for a prefect electrical connection between a connection contact and the associated connecting part. The ensured electrically conductive connection of a connection contact to an associated connecting part by means of at least one remnant of a raised portion is also based inter alia on the fact that, because the raised portions are so small, they can be deformed to a given extent; in practice this ensures that always a comparatively large number of such remnants of raised portions form an electrically conductive connection between a connection contact and an associated connecting part, the deformability of the raised portions offering the desired result while imposing only comparatively minor requirements as regards the parallelism of the integrated component with its connection contacts and the plate-shaped connecting parts.

In embodiments in accordance with the invention the remnants of raised portions may originate from raised portions which have been realized, for example, by means of an etching method. However, it has been found to be particularly advantageous when the remnants of raised portions originate from raised portions which have been formed by means of stamping. This is advantageous with a view to achieving an as simple and economical realization as possible of the raised portions. This is also advantageous because such stamping can be performed simultaneously with a stamping operation carried out to form the connecting parts.

In embodiments in accordance with the invention the remnants of raised portions may have a height of between 0.2 µm and 20 µm. However, it has been found that it is particularly advantageous when the remnants of raised portions have a height of between 1.0 µm and 10 µm. Tests have demonstrated that such a construction is particularly advantageous.

The remnants of raised portions in the transitional zone to the connecting parts in embodiments of the invention may have a lateral length of between 1.0 µm and 100 µm. However, it has been found that it is particularly advantageous when the remnants of raised portions have a lateral length of between 10 µm and 50 µm in the transitional zone to the connecting parts. Tests have again demonstrated that this is particularly advantageous for practical applications. The remnants of raised portions may have a triangular or rectangular or square shape, but also a circular shape in a cross-section taken parallel to the plate-shaped connecting parts.

For the solutions in accordance with the invention it has been found that it is very advantageous to provide a filler material, enclosing the connection contacts and the remnants of raised portions, between the integrated component and the connecting parts. In this respect it has been found that it is very advantageous when the filler material is formed by a foil which consists of a synthetic material and can be softened at least once by heating. Such embodiments in accordance with the invention offer the advantage that the remnants of raised portions and additionally also the portions of the connecting parts which are electrically conductively connected to the connection contacts are protected against environmental effects.

The above aspects and further aspects of the invention will become apparent from and elucidated on the basis of the embodiment described hereinafter.

The invention will be described in detail hereinafter with reference to an embodiment as shown in the drawing, however, without the invention being limited thereto.

Figure 1:
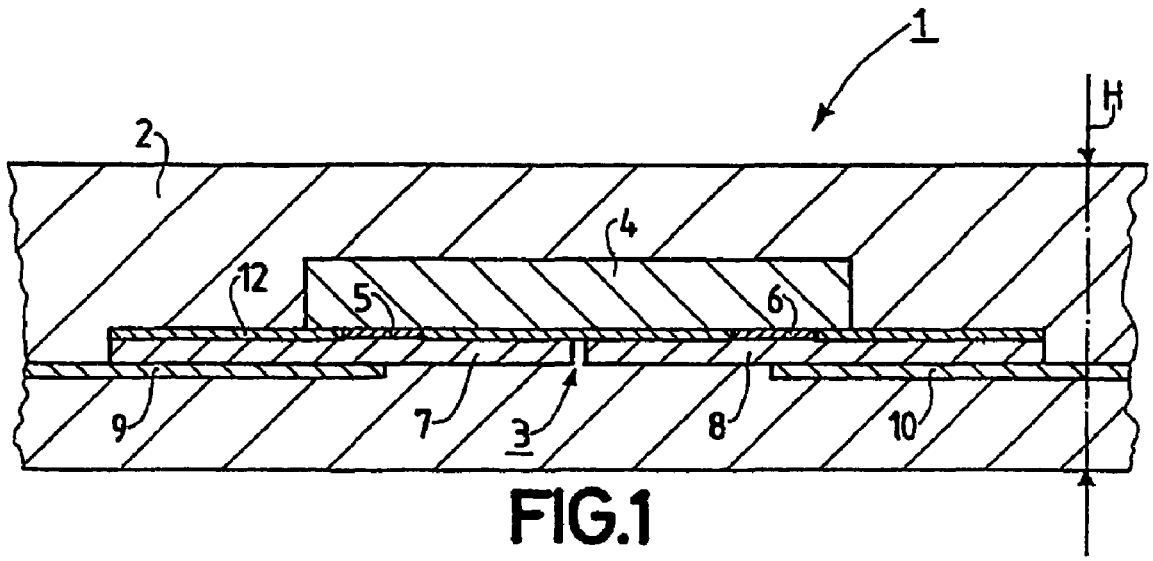
FIG. 1 is a sectional view of a part of an embodiment of a data carrier in accordance with the invention with an embodiment of the module in accordance with the invention.
Figure 2:
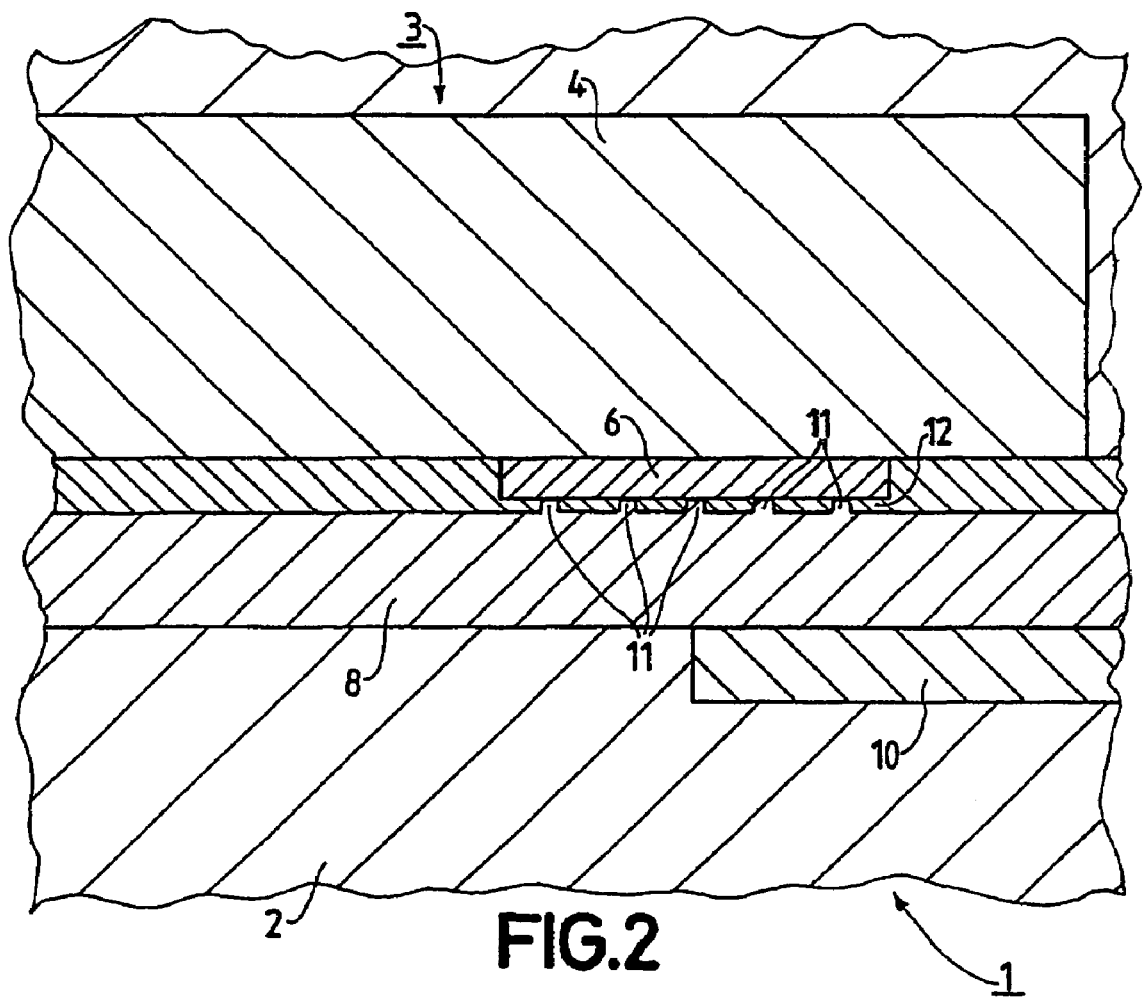
FIG. 2 shows a detail of the data carrier of FIG. 1 at a scale which is about five times larger.

The FIGS. 1 and 2 show the part of a data carrier 1 which is essential in the present context. The data carrier 1 is arranged for the wireless communication with a communication station which is suitable for this purpose and is constructed as a so-called chip card in the present case. However, other configurations such as so-called labels or tags are also feasible.

The data carrier 1 includes an envelope body 2 which has been manufactured during a lamination process. The envelope body 2, however, may also have been formed by means of an injection molding process. The envelope body 2 accommodates a module 3 for the data carrier 1. The module 3 comprises an integrated component 4 with a first connection contact 5 and a second connection contact 6. Each of the two connection contacts 5 and 6 is formed by a so-called bump which is made of gold and has been formed galvanically. For each connection contact 5 and 6 the module 3 also comprises a connecting part which is electrically conductively connected to the relevant connection contact 5, 6, that is, a first connecting part 7 and a second connecting part 8. The two connecting parts 7 and 8 form part of a so-called metal lead frame which has been known since long. Each of the two connecting parts 7 and 8 is connected to a coil terminal, the first connecting part 7 being electrically conductively connected to a first coil terminal 9 while the second connecting part 8 is electrically conductively connected to a second coil terminal 10. The two coil terminals 9 and 10 form part of a transmission coil of the data carrier 1 whereby wireless communication can be carried out. FIG. 1 shows only the two coil terminals 9 and 10 of this transmission coil and FIG. 2 shows only the coil terminal 10. Instead of comprising coil terminals 9 and 10, the data carrier 1 may also comprise two connection surfaces of capacitively operative transmission means.

As can be seen in the FIGS. 1 and 2, the two connection contacts 5 and 6 are constructed so as to project from the integrated component 4. In respect of the two connecting parts 7 and 8 it may be stated that they are made of metal and are constructed so as to be plate-shaped as is customary in the case of a metal lead frame.

The data carrier 1 and the module 3 shown in the FIGS. 1 and 2 are advantageously constructed in such a manner that, as is shown in FIG. 2, the two connecting parts 7 and 8 include remnants 11 of raised portions which have been formed by mechanical deformation of the connecting parts 7 and 8 prior to the manufacture of the module 3 or the data carrier 1. Said remnants 11 of raised portions project from the connecting parts 7 and 8 in the direction of the associated connection contacts 5 and 6. In the data carrier and the module 3 shown in the FIGS. 1 and 2, the remnants 11 originate from raised portions formed by stamping, that is, raised portions formed by means of a stamping tool.

As regards the dimensions of the data carrier 1 and the module 3 and the constituents thereof it is to be noted that the data carrier 1 has a nominal thickness or height H of 800 µm. The integrated component 4 has a nominal height of 180 µm; however, it may also have a smaller height of, for example, 150 µm and less. The two connection contacts 5 and 6 have a measurable height of approximately 20 µm relative to the integrated component 4. The two connecting parts 7 and 8 have a height of approximately 60 µm; however, they may also have a height in the range of from 60 µm to 80 µm. The coil terminals 9 and 10 have a height of approximately 30 µm; however, they may also have a height in the range of from 25 µm to 40 µm. The remnants 11 of raised portions have a height of approximately 5 µm; however, they may also have a height of between 1.0 µm and 10 µm or also 20 µm. The remnants 11 of raised portions have a square cross-section in a cross-sectional view taken transversely of the height direction, the remnants 11 of raised portions having a lateral length of approximately 20 µm in the transitional zone to the connecting parts 7 and 8. However, they may also have a lateral length of between 10 µm and 50 µm or also 100 µm. As can be seen in FIG. 2, the remnants 11 of raised portions are shaped so as to be tapered in a direction pointing away from the connecting parts 7 and 8.

In the data carrier 1 and the module 3 in accordance with the FIGS. 1 and 2 a filler material 12 is provided between the integrated component 4 and the connecting parts 7 and 8; this filler material encloses the connection contacts 5 and 6 and the remnants 11 of raised portions; in the present case said filler material is formed by a foil which consists of a synthetic material and can be softened at least once by heating. The connection contacts 5 and 6 and the remnants 11 of raised portions, being electrically conductively connected to the connection contacts 5 and 6, and the connecting parts 7 and 8 are protected against environmental effects by the filler material in the form of the foil.

The remnants 11 of raised portions are formed by the deformation of raised portions originally formed during the manufacture of the data carrier 1 or the module 3. The remnants 11, however, may also be formed by raised portions which have not been deformed and are still in their original condition; this is the case if no deformation of the originally formed raised portions has taken place during the manufacture of the data carrier 1 or the module 3.

The remnants 11 ensure that, even when the elements of the module which have been brought into operative contact, that is, the integrated component 4 with its two connection contacts 5 and 6 and the plate-shaped connecting parts 7 and 8, are not exactly in parallel, a perfect, electrically conductive connection is formed nevertheless between the remnants 11, and hence the connecting parts 7 and 8, on the one side and the connection terminals 5 and 6 of the integrated component 4 on the other side.

The invention claimed is:

1. A module for a data carrier, which module includes an integrated component with at least two connection contacts and, for each connection contact, a connecting part which is electrically conductively connected to the relevant connection contact, the connection contacts being constructed so as to project from the integrated component and provide a first major surface; and the connecting parts consisting of metal and being constructed so as to be plate-shaped, the connecting parts comprising remnants of raised portions which have been formed by mechanical deformation of the connecting parts, which remnants project from the connecting parts in the direction of the connection contacts;

wherein two or more of the remnants which project from each of the connecting parts in the direction of the connection contacts are physically in contact with the first major surface of the relevant connection contact.

2. A module as claimed in claim 1, in which the remnants of raised portions originate from raised portions formed by stamping.

3. A module as claimed in claim 1, in which the remnants of raised portions have a height of between 1.0 μm and 10 μm.

4. A module as claimed in claim 1, in which the remnants of raised portions have a lateral length of between 10 μm and 50 μm in a transitional zone to the connecting parts.

5. A module as claimed in claim 1, in which a filler material which encloses the connection contacts and the remnants of raised portions is provided between the integrated component and the connecting parts.

6. A module as claimed in claim 5, in which the filler material is formed by a foil which consists of a synthetic material and can be softened at least once by heating.

7. A data carrier provided with a module which includes an integrated component with at least two connection contacts and, for each connection contact, a connecting part which is electrically conductively connected to the relevant connection contact, the connection contacts being constructed so as to project from the integrated component and provide a first major surface; and the connecting parts consisting of metal and being constructed so as to be plate-shaped, the connecting parts comprising remnants of raised portions which have been formed by mechanical deformation of the connecting parts, which remnants project from the connecting parts in the direction of the connection contacts;

wherein two or more of the remnants which project from each of the connecting parts in the direction of the connection contacts are physically in contact with the first major surface of the relevant connection contact.

8. A data carrier as claimed in claim 7, in which the remnants of raised portions originate from raised portions formed by stamping.

9. A data carrier as claimed in claim 7, in which the remnants of raised portions have a height of between 1.0 μm and 10 μm.

10. A data carrier as claimed in claim 7, in which the remnants of raised portions have a lateral length of between 10 μm and 50 μm in a transitional zone to the connecting parts.

11. A data carrier as claimed in claim 7, in which a filler material which encloses the connection contacts and the remnants of raised portions is provided between the integrated component and the connecting parts.

12. A data carrier as claimed in claim 11, in which the filler material is formed by a foil which consists of a synthetic material and can be softened at least once by heating.

* * * * *